US005758270A

United States Patent [19]
Okanobu

[11] Patent Number: 5,758,270
[45] Date of Patent: May 26, 1998

[54] LEVEL CONTROL CIRCUIT FOR RECEIVER

[75] Inventor: Taiwa Okanobu, Tokyo, Japan

[73] Assignee: Sony Corporation, Tokyo, Japan

[21] Appl. No.: 638,161

[22] Filed: Apr. 26, 1996

[30] Foreign Application Priority Data

May 9, 1995 [JP] Japan ................... 7-135971

[51] Int. Cl.$^6$ ................................................ H03G 3/30
[52] U.S. Cl. .......................... 455/234.1; 455/248.1; 455/249.1; 330/278
[58] Field of Search ...................... 455/219, 234.1, 455/234.2, 248.1, 249.1, 271, 296, 333, 280, 291, 293, 127; 330/284, 288, 302, 278

[56] References Cited

U.S. PATENT DOCUMENTS

| | | | |
|---|---|---|---|
| 3,582,681 | 6/1971 | Norman | 307/237 |
| 3,912,946 | 10/1975 | Graziadei | 307/264 |
| 4,249,137 | 2/1981 | Malchow | 455/249.1 |
| 4,704,738 | 11/1987 | Graziadei et al. | 455/249.1 |
| 4,736,166 | 4/1988 | Eckland et al. | 330/284 |
| 4,763,024 | 8/1988 | Gay | 330/278 |

FOREIGN PATENT DOCUMENTS

| | | | |
|---|---|---|---|
| 2248648 | 5/1975 | France | H03H 11/00 |
| 261208 | 12/1985 | Japan | H03H 11/24 |
| 1350142 | 4/1974 | United Kingdom | H03G 3/00 |

*Primary Examiner*—Reinhard J. Eisenzopf
*Assistant Examiner*—Lester G. Kincaid
*Attorney, Agent, or Firm*—Jay H. Maioli

[57] ABSTRACT

An emitter of a transistor Q22 and a collector of a transistor Q23 are connected in series. The transistors Q22 and Q23 are of the same polarity. The transistor Q23 is connected to function as a diode for an alternating current. To the junction point between the emitter of the transistor Q22 and the collector of the transistor Q23, an input signal source 11 is connected and also a circuit 13 of the subsequent stage is connected. A transistor Q25 is supplied with a bias voltage equal to that of the transistor 21. A transistor Q28 detects a difference between a collector current of the transistor Q25 and a current having a reference level. The level of a collector current of the transistor Q22 is controlled by a level control signal. The detected output of the transistor 28 is supplied to the transistor 23 as a control signal for a collector current of the transistor 23. This structure places no constraints on the construction of subsequent stages of the circuitry.

2 Claims, 2 Drawing Sheets

LEVEL CONTROL CIRCUIT FOR RECEIVER

BACKGROUND OF THE INVENTION

The present invention relates to a level control circuit for a receiver.

FIG. 1 illustrates one example of a circuit of a receiver of the superheterodyne system. A broadcast wave signal is received through an antenna circuit 11 and the signal so received is supplied to a mixer circuit 14 through an attenuator circuit 12 for automatic gain control (hereinafter abbreviated as "AGC") and a high-frequency amplifier 13. In addition, a local oscillation signal of a frequency corresponding to a received frequency is taken out from a local oscillator circuit 15. This local oscillation signal is supplied to the mixer circuit 14.

In this manner, the received signal of a target frequency is converted into an intermediate frequency signal of a predetermined frequency. The intermediate frequency signal is supplied to a detector circuit 18 through a band-pass filter 16 and an intermediate-frequency amplifier 17, whereby an audio signal is demodulated and then, the audio signal thus demodulated is taken out.

At the same, a portion of the demodulated output of the detector circuit 18 is supplied to a voltage formation circuit 19, whereby an AGC voltage $V_{AGC}$ is formed. This AGC voltage $V_{AGC}$ is supplied to the attenuator circuit 12 and the intermediate-frequency amplifier 17 to effect AGC.

In this case, construction of the high-frequency amplifier 13 by an emitter-grounded transistor makes it possible not only to increase gain but also to decrease noise. Input-output characteristics (characteristics of an output current relative to an input voltage) are exponential so that the level of an input signal which can be amplified with a low distortion is several tens mV or lower.

In the attenuator circuit 12, AGC is therefore conducted in a manner to attenuate a signal level, whereby, even if the level of a received signal is high, it is controlled not to exceed a dynamic range of the high-frequency amplifier 13 or the mixer circuit 14.

Described specifically, in the attenuator circuit 12, the received signal from the antenna circuit 11 is divided in voltage in accordance with an output impedance of the antenna circuit 11 and impedances of the emitters of the transistors Q15 and Q18 and the received signals so divided are supplied to the high-frequency amplifier 13.

At this time, the AGC voltage $V_{AGC}$ is supplied to a transistor Q12 through a transistor Q11, and the transistors Q12 and Q13 form a current mirror circuit. From the viewpoint of a direct current, transistors Q14 and Q15 form another current mirror circuit through a coil L11.

Furthermore, the AGC voltage $V_{AGC}$ is supplied through a transistor Q16 to a transistor Q17. The transistors Q17 and Q18 form a further current mirror circuit through the coil L11.

Accordingly, the AGC voltage $V_{AGC}$ causes changes in collector currents of the transistors Q14 and Q17, leading to a change in the impedances of the emitters of the transistors Q15 and Q18, which then causes a change in the ratio of voltage division in accordance with the output impedance of the antenna circuit 11 and the impedances of the emitters of the transistors Q15 and Q18. The level of the received signal supplied to the high-frequency amplifier 13 is limited so that it does not exceed the dynamic range of the high-frequency amplifier 13 or the mixer circuit 14. In other words, level-attenuating AGC is conducted.

According to this attenuator circuit 12, even if the transistors Q15 and Q18 differ in characteristics from each other and have emitter currents different in magnitude, a current corresponding to their difference flows into a voltage supply $V_{REG}$ through the coil L11 or flows out from the voltage supply $V_{REG}$. The inputted DC voltage of the high-frequency amplifier 13 is therefore maintained at a constant value $V_{REG}$. Accordingly, the attenuator circuit 12 can be brought into a DC direct connection with the high-frequency amplifier 13. The attenuator circuit is therefore suited for formation into an IC.

In the attenuator circuit 12 shown in FIG. 1, however, the voltage of the voltage supply $V_{REG}$ becomes, as is, a bias voltage to the first-stage transistor of the high-frequency amplifier 13. When the high-frequency amplifier 13 is formed of an emitter-grounded transistor, the level of the voltage of the voltage supply $V_{REG}$ is inevitably limited to a level a little higher than a base-emitter voltage.

The collector-emitter voltage of the transistor Q16 then becomes eminently low, because a voltage lower than the voltage of the voltage supply $V_{REG}$ by the emitter-base voltage of the transistor Q17 is the collector-emitter voltage of the transistor Q16. The transistor Q16 then becomes liable to be saturated. If the transistor Q16 is saturated, the transistor Q18 becomes off, resulting in an increase in the distortion of a received signal supplied to the high-frequency amplifier 13 or the narrowing of a control range of AGC.

In this attenuator circuit 12, it is necessary to make a large collector current flow to the transistors Q15 and Q18 with a view to widening the control range. In the case of a transistor having a lateral structure, sufficient attenuation characteristics cannot be obtained because of its inferior high-frequency characteristics.

Furthermore, when collector currents of the transistors Q15 and Q18 are increased, there appears a large difference in the direct current characteristics between the transistor Q15 and the transistor Q18, resulting in a marked increase in the difference between the collector current of the transistor Q15 and the collector current of the transistor Q18. Consequently, the voltage supply $V_{REG}$ is obliged to have a complex structure because of the necessity of absorbing such a large difference in the electric current while maintaining a stable voltage.

SUMMARY OF THE INVENTION

It is therefore an object of the present invention is to provide a level control circuit for a receiver.

The present invention therefore provides a level control circuit comprising:

- a first transistor having a collector for the supply of a power voltage thereto and a base for the supply of a level control signal thereto;
- a second transistor having a collector connected to an emitter of said first transistor at a junction point to which an input signal is supplied, an emitter of said second transistor being grounded;
- a third transistor having a base connected to said junction point, a collector from which said output signal is outputted responsive to said input signal, and a grounded emitter;
- a fourth transistor having a base, which is coupled to said base of said third transistor so that said base of said fourth transistor and said base of said third transistor have the same potential, a grounded emitter and a collector for the supply of a constant current thereto; and a fifth transistor having a base connected to said collector of said fourth transistor, an emitter for the supply of a predetermined voltage thereto, and a collector operably connected to a base of said second transistor.

An input signal is divided in voltage in accordance with an output impedance of the input signal source and an impedance of the first and second transistors, whereby a level control is conducted. The signal so level-controlled is supplied to a next-stage circuit. At this time, an increase from the reference value of the collector current of the first transistor flows into the second transistor.

DETAILED DESCRIPTION OF THE PREFERRED EMBODIMENTS

Figure 2:
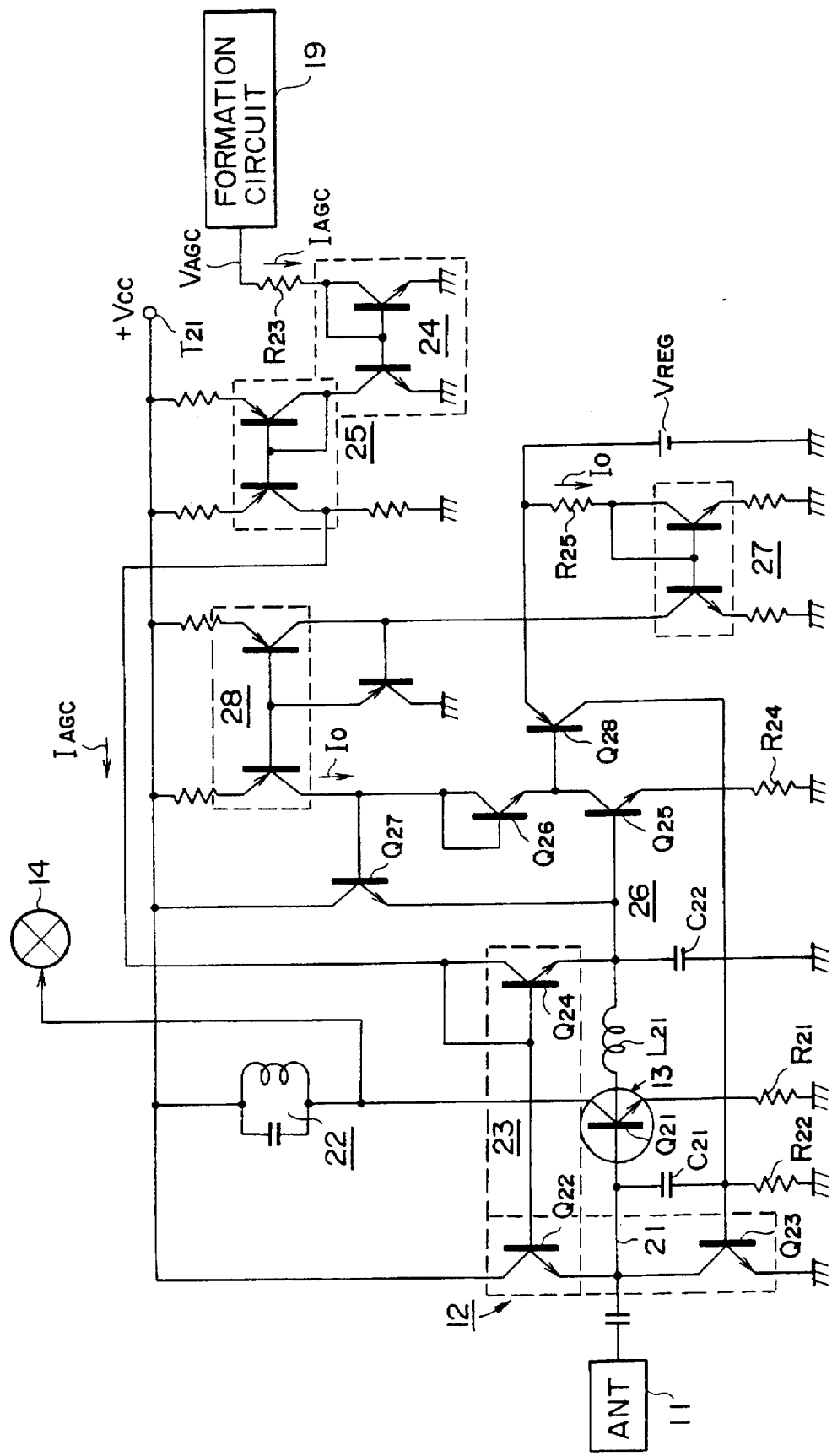
FIG. 2 illustrates a level control circuit according to one embodiment of the present invention.

In FIG. 2, an antenna circuit 11 is connected to a base of a transistor Q21 through a high-frequency signal line 21. The transistor Q21 forms a high-frequency amplifier 13. Described specifically, the emitter of the transistor Q21 is grounded through a resistor R21 and its collector is connected to a power source terminal T21 through a load which is a tuning circuit 22 in this example and also to a mixer circuit 14, whereby the high-frequency amplifier 13 is formed of this emitter-grounded transistor Q21.

In addition, transistors Q22 and Q23 are provided. Between the power source terminal T21 and the high-frequency signal line 21, a collector-emitter circuit of the transistor Q22 is connected, while between the high-frequency signal line 21 and the earth (or ground), a collector-emitter circuit of the transistor Q23 is connected.

Furthermore, a condenser C21 is connected between the high-frequency signal line 21 and the base of the transistor Q23. The transistor Q23 is constructed to serve as a diode at the time when a high-frequency signal is added. Between the base of the transistor Q23 and its earth, a resistor R22 is connected. Thus, an attenuator circuit 12 is formed mainly of the transistors Q22 and Q23.

Furthermore, the transistor Q24 is provided and its emitter is connected to the high-frequency signal line 21 through a coil L21. Between the emitter of a transistor Q24 and its earth, a by-pass condenser C22 is connected and the base and collector of the transistor Q24 are connected to the base of the transistor Q22.

In this case, as a consequence, the emitters of the transistor Q22 and Q24 are commonly connected to the high-frequency signal line 21 so that a current mirror circuit 23 is formed of the transistors Q22 and Q24. Accordingly, at this time, the transistor Q24 serves as a transistor on an input side, while the transistor Q22 serves as one on an output side.

An AGC voltage $V_{AGC}$ from an AGC voltage formation circuit 19 is converted to an AGC current $I_{AGC}$ through a resistor R23. This AGC current $I_{AGC}$ is supplied to the transistor Q24 through current mirror circuits 24 and 25. In this case, an AGC current $I_{AGC}$ is controlled to change toward a smaller value when a received signal is on a low level and to become 0 when the received signal is on a level not higher than a predetermined value.

Between the emitter and the earth of the transistor Q25, a resistor R24 is connected and the base of the transistor Q25 is connected to the emitter of the transistor Q24. The collector of the transistor Q25 is connected to the emitter of the transistor Q26 which is connected to function as a diode.

In addition, a transistor Q27 is provided. The transistor Q27 has a base connected to the base and the collector of the transistor Q26, an emitter connected to the base of the transistor Q25 and a collector connected to a power source terminal T21.

In this case, the bases of the transistors Q21 and Q25 are connected to each other through a coil L21. A fraction of an output current $I_O$ of a current mirror circuit 28 is supplied through the transistor Q27 to the bases of the transistors Q21 and Q25 so that a current mirror circuit 26 is formed of the transistors Q25, Q21 and Q27 when operated with a direct current.

At this time, the transistor Q25 is formed to work as a transistor on an input side and the transistor Q21 is formed to work as one on an output side so that the junction area between the base and the emitter of the transistor Q21 is set at n times (n>1), for example, 6 times as much as that of the transistor Q25.

A stabilized voltage from the voltage supply $V_{REG}$, for example, 1.3 V is supplied to a resistor R25, where it is converted into a current $I_O$ having a reference level and this current $I_O$ is supplied to the transistor Q25 through the current mirror circuits 27 and 28 and the transistor Q26.

A transistor Q28 is formed to have a base connected to the collector of the transistor Q25, an emitter connected to the voltage supply $V_{REG}$ and a collector connected to the base of the transistor Q23.

Another circuit is not illustrated but is formed to have a similar construction as the circuit shown in FIG. 2.

In such a construction, when the received signal is not higher than a predetermined reception level, $I_{AGC}$ becomes 0 and accordingly the transistor Q24 becomes off. The transistors Q24 and Q22 form the current mirror circuit 23 when operated with a direct current so that when the transistor Q24 is off, the transistor Q22 also becomes off.

A current $I_O$ flows in the collector of the transistor Q25 through the transistor Q26. Assuming that the collector-emitter voltage of the transistor Q25 at this time is 0.9 V, as $V_{REG}$ is 1.3 V, the base-emitter voltage of the transistor Q28 becomes 0.4 V (=1.3 V–0.9 V) and the transistor Q28 becomes off. When the transistor Q28 is off, the transistor Q23 is accordingly off.

When the received signal is not higher than a predetermined reception level, the received signal from the antenna circuit 11 is supplied to the transistor Q21 without being attenuated by the attenuator circuit 12 and after amplification, it is supplied to the mixer circuit 14.

At this time, the transistors Q25 and Q21 form a current mirror circuit 26 when operated with a direct current. Furthermore, the junction area between the base and the emitter of the transistor Q21 is set at n times as large as that of the transistor Q25 so that a current $nI_O$ passes through the transistor Q21. In other words, a collector current which has a predetermined reference level flows through the transistor Q21. Accordingly, a predetermined gain can be obtained from the transistor Q21.

The larger the level of the received signal, the larger the AGC current $I_{AGC}$. As a result, the transistor Q24 becomes on, the collector current becomes larger and the collector current of the transistor Q22 also becomes larger.

With an increase in the collector currents of the transistors Q24 and Q22, the DC potential of the high-frequency signal line 21 tends to rise. This means an increase in the base potential of the transistor Q25 so that the collector current of the transistor Q25 tends to become larger than the current $I_O$.

The transistor Q28 then becomes on, which makes the transistor Q23 on. Increases in the collector currents of the transistors Q24 and Q22 pass through the transistor Q23. As a result, the DC potential of the high-frequency signal line 21 does not show an increase.

In other words, when the AGC current $I_{AGC}$ becomes larger with an increase in the level of the received signal, the collector current of the transistor Q22 increases, followed by an increase in the collector current of the transistor Q25. This increase (difference from the current $I_O$) is detected by the transistor Q28 and this detected output raises the collector current of the transistor Q23.

Accordingly, even if the level of the received signal changes, there is substantially no change in the DC potential of the high-frequency signal line 21 and the bias voltage of the transistor Q21 is maintained at almost a constant value.

When the level of the received signal becomes larger, the collector currents of the transistors Q22 and Q23 show an increase as described above. At this time, the collector-base of the transistor Q23 is shorted by the condenser C21 so that the transistor Q23 functions as a diode when operated with a high frequency.

Accordingly, the received signal supplied from the antenna circuit 11 to the high-frequency signal line 21 is divided in voltage in accordance with an output impedance of the antenna circuit 11 and impedances of the transistors Q22 and Q23. In short, attenuating level control is conducted.

According to the circuit of the present invention, AGC can be conducted in accordance with this attenuating level control. Even if the allowable range of an inputted signal voltage of the next-stage high-frequency amplifier 13 is narrow, normal operation can be conducted, which makes it possible to make the transistor Q21 an emitter-grounded transistor. Furthermore, AGC does not cause a substantial change in the base bias voltage of the transistor Q21. In other words, an actuation point of the transistor Q21 shows almost no change.

To widen the level control range, it is necessary to increase the collector currents of the transistor Q22 and Q23. Transistors Q22 and Q23 are of the same polarity so that even if the collector currents are large, they are able to have similar characteristics and furthermore, they are advantageous for formation into an IC.

Figure 1:
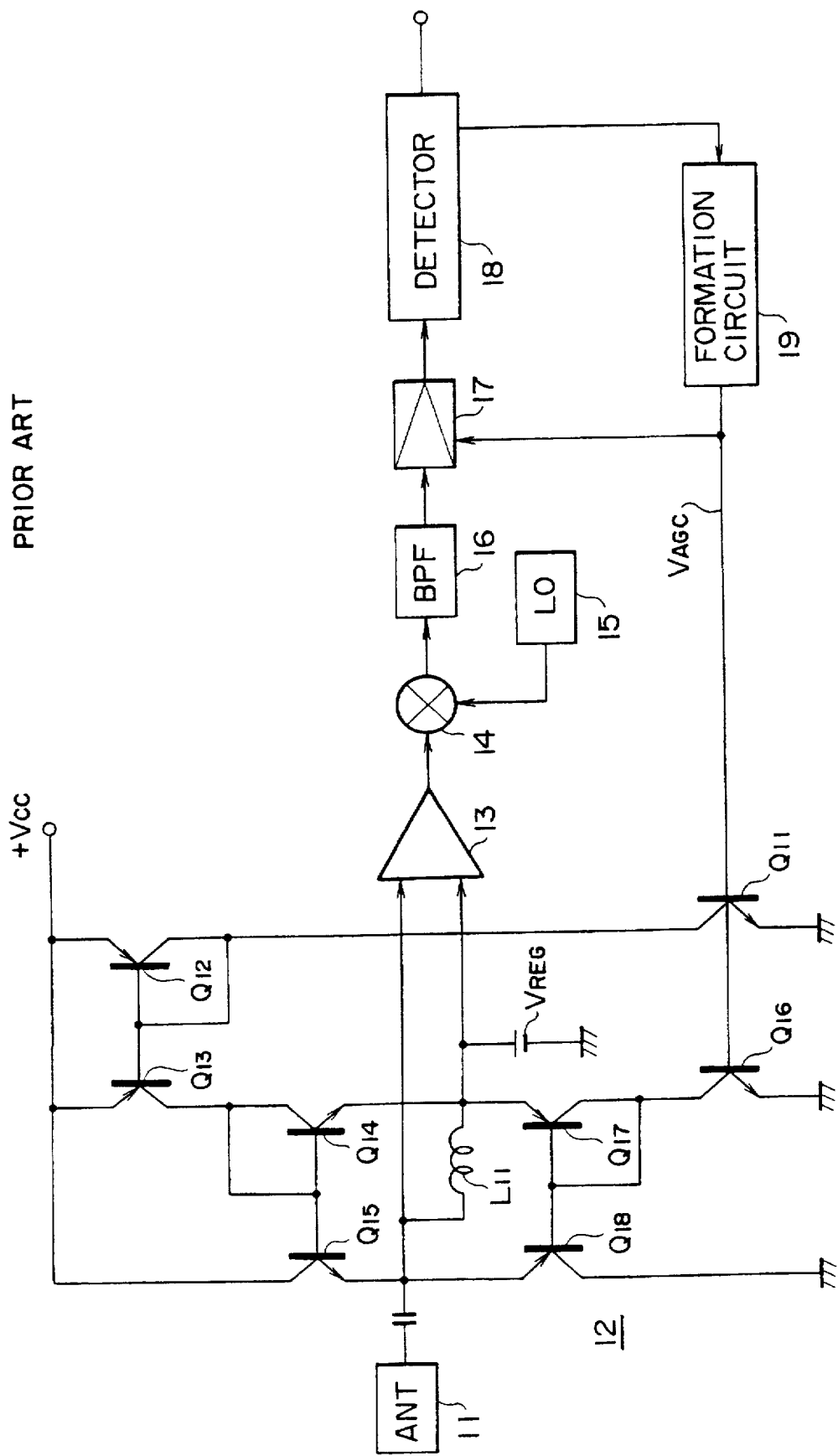
FIG. 1 illustrates a circuit of a general receiver.

In the attenuator circuit 12 shown in FIG. 1, when there is a difference between the collector current of the transistor Q15 and the collector current of the transistor Q18, a current corresponding to the difference can be made flow irrespective of the polarity thereof. It is therefore necessary to form the voltage supply $V_{REG}$ as a bi-directional type. According to the above-described attenuator circuit of the present invention, on the other hand, such a bi-directional voltage supply is not required and a voltage supply $V_{REG}$ can therefore be structurally simplified.

According to the present invention, attenuating level control can be conducted and in this case, the transistor of the next-stage amplifier can be formed as an emitter grounded transistor. In addition, the level control does not cause a change in the base bias voltage of the next-stage transistor. Furthermore, the transistors for level control are of the same polarity so that they are able to have similar characteristics and are advantageous for formation into an IC.

What is claimed is:

1. A level control circuit comprising:

a first transistor having a collector for the supply of a power voltage thereto, a base for the supply of a level control signal thereto, and an emitter;

a second transistor having a collector connected to said emitter of said first transistor at a junction point to which an input signal is supplied, a grounded emitter, and a base;

a third transistor having a base connected to said junction point, a collector from which an output signal is outputted responsive to said input signal, and a grounded emitter;

a fourth transistor having a base coupled to said base of said third transistor so that said base of said fourth transistor and said base of said third transistor have the same potential, a grounded emitter, and a collector for the supply of a constant current thereto; and a fifth transistor having a base connected to said collector of said fourth transistor, an emitter for the supply of predetermined voltage thereto, and a collector operably connected to said base of said second transistor.

2. A receiver comprising:

an antenna circuit for receiving a transmitted signal;

a demodulator circuit for producing a level control signal and demodulating an output signal; and a level circuit, said level circuit comprising:

a first transistor having a collector for the supply of a power voltage thereto, a base for the supply of a level control signal thereto, and an emitter;

a second transistor having a collector connected to said emitter of said first transistor at a junction point to which an input signal is supplied from said antenna circuit, a grounded emitter, and a base;

a third transistor having a base connected to said junction point, a collector from which said output signal is outputted responsive to said input signal, and a grounded emitter;

a fourth transistor having a base coupled to said base of said third transistor so that said base of said fourth transistor and said base of said third transistor have the same potential, a grounded emitter, and a collector for the supply of a constant current thereto, and a fifth transistor having a base connected to said collector of said fourth transistor, an emitter for the supply of a predetermined voltage thereto, and a collector operably connected to said base of said second transistor.

* * * * *